(12) United States Patent
Zabroda et al.

(10) Patent No.: US 6,891,428 B1
(45) Date of Patent: May 10, 2005

(54) SINGLE ENDED CONTROLLED CURRENT SOURCE

(75) Inventors: Oleksiy Zabroda, Sacramento, CA (US); David S. Nack, Mission Viejo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/722,544

(22) Filed: Nov. 28, 2003

(51) Int. Cl.[7] .............................................. G05F 1/10
(52) U.S. Cl. ...................................................... 327/543
(58) Field of Search ................................. 327/108, 530, 327/534–538, 540–541, 543–546; 323/312

(56) References Cited

U.S. PATENT DOCUMENTS 5,610,505 A * 3/1997 Bernardson et al. ........ 323/312
6,194,956 B1 * 2/2001 Barnes ........................ 327/538
6,556,070 B2 * 4/2003 Paulus ........................ 327/543
6,583,740 B2 * 6/2003 Schofield et al. ........... 341/120

* cited by examiner

Primary Examiner—My-Trang Nu Ton
(74) Attorney, Agent, or Firm—Fleshner & Kim, LLP

(57) ABSTRACT

An apparatus and method for a controlled current source are provided. The apparatus may include at least one current cell. Each current cell includes first, second and third transistors. The first transistor can be configured as a switch transistor. The second transistor can be configured as a current controller and can be coupled in series with the first transistor. The third transistor has a gate and a substrate coupled to a gate and a substrate of the second transistor, respectively. The drain and source of the third transistor can be coupled to a second input configured to receive a second signal that is a compliment of a first signal received at an input of the first transistor.

35 Claims, 7 Drawing Sheets

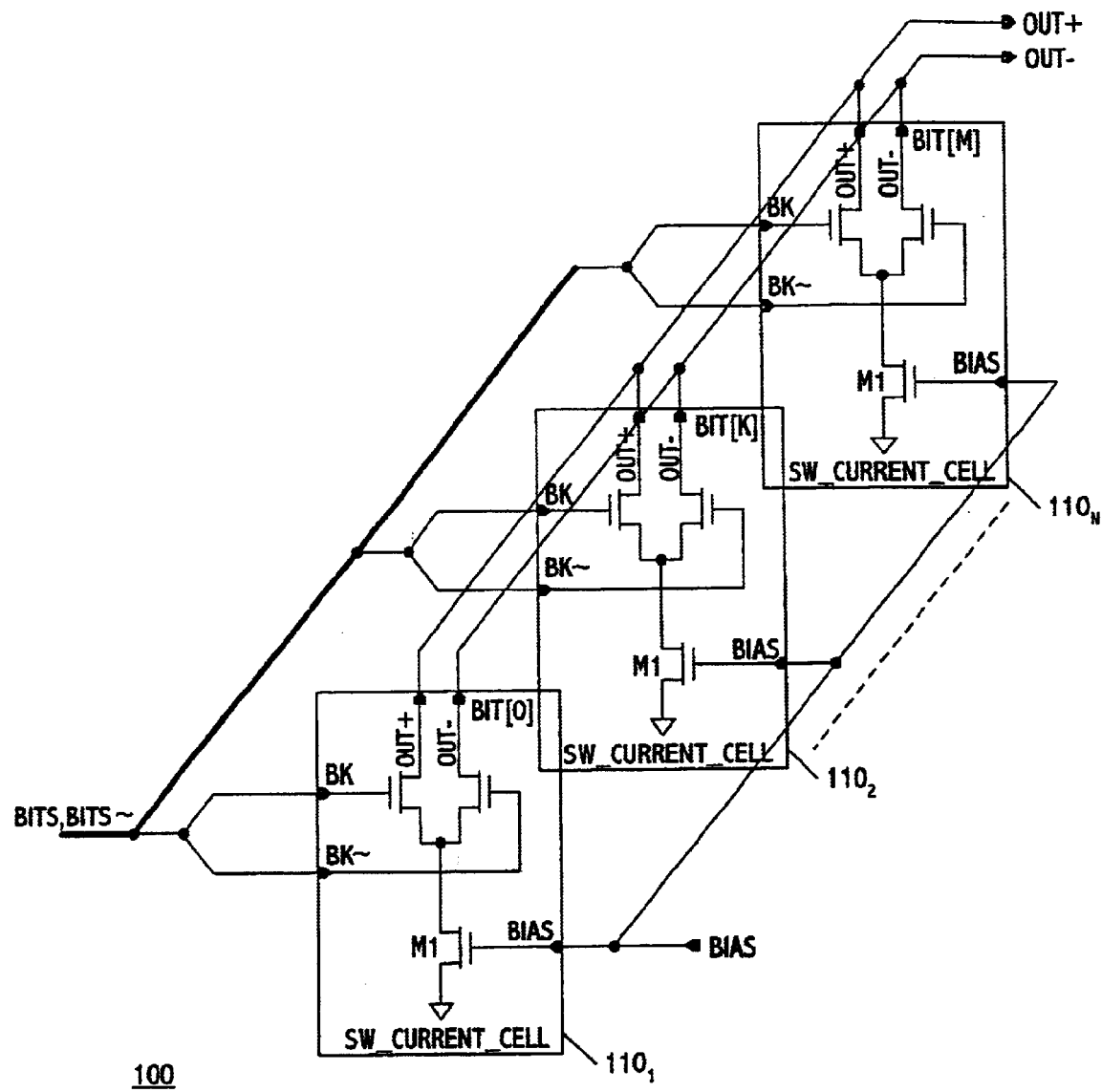
RELATED ART
FIG. 1

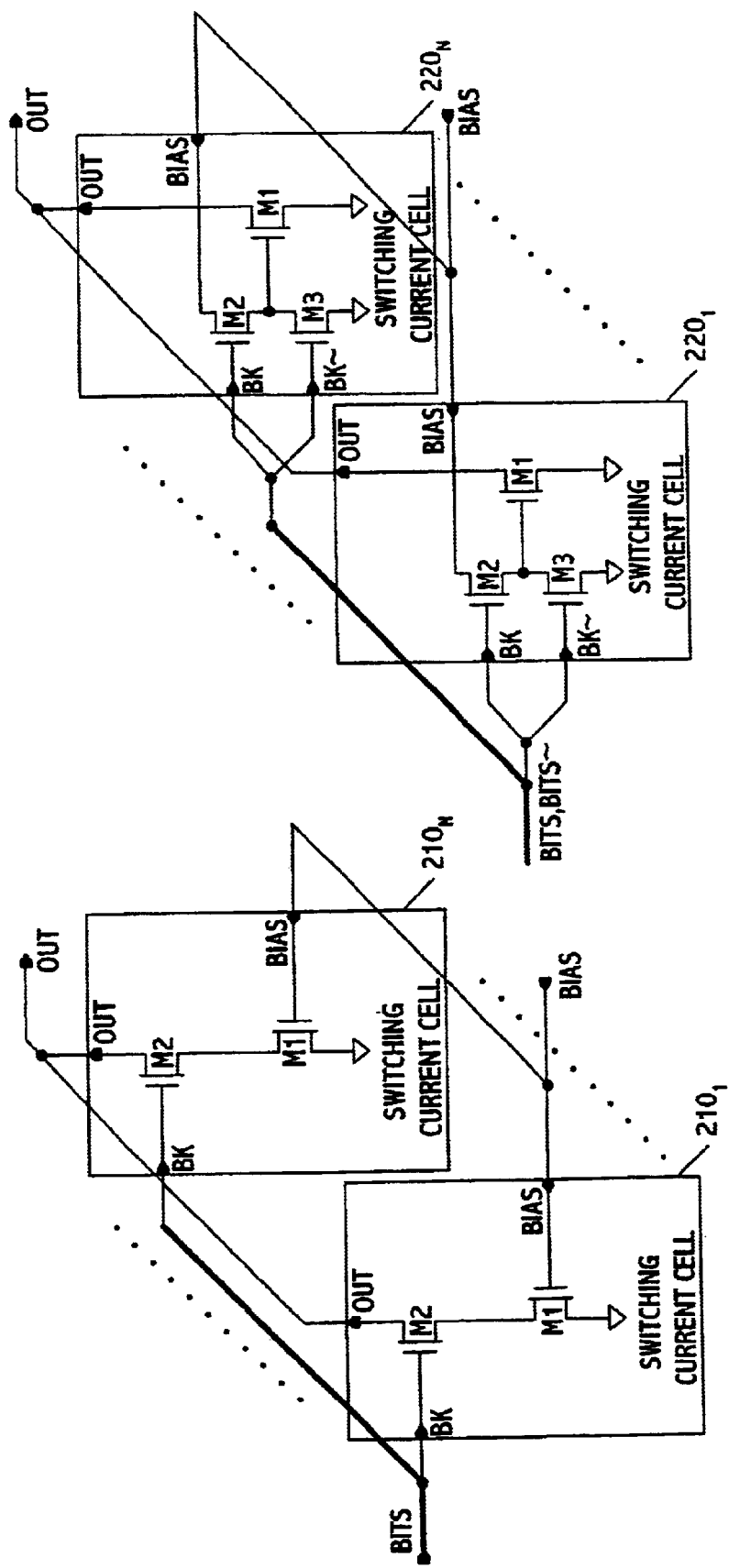
RELATED ART
FIG. 2B
RELATED ART
FIG. 2A

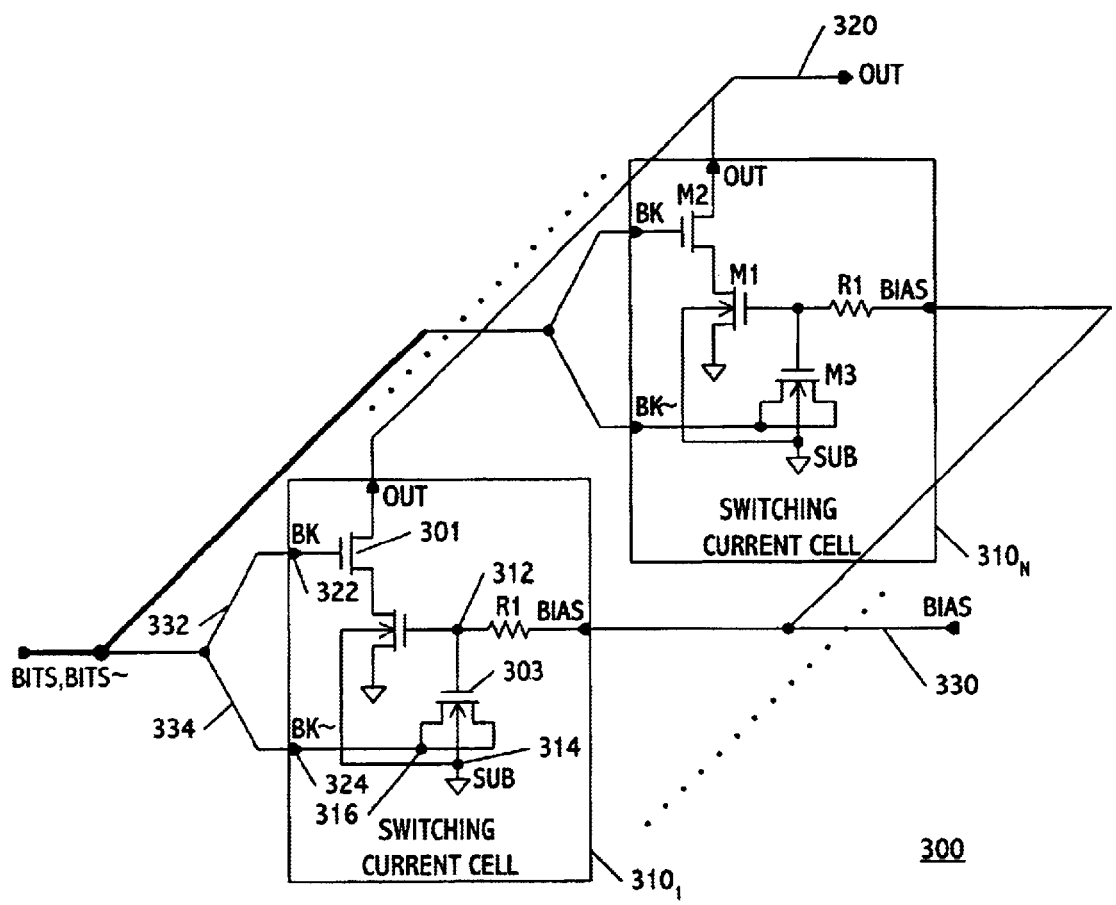
FIG. 3

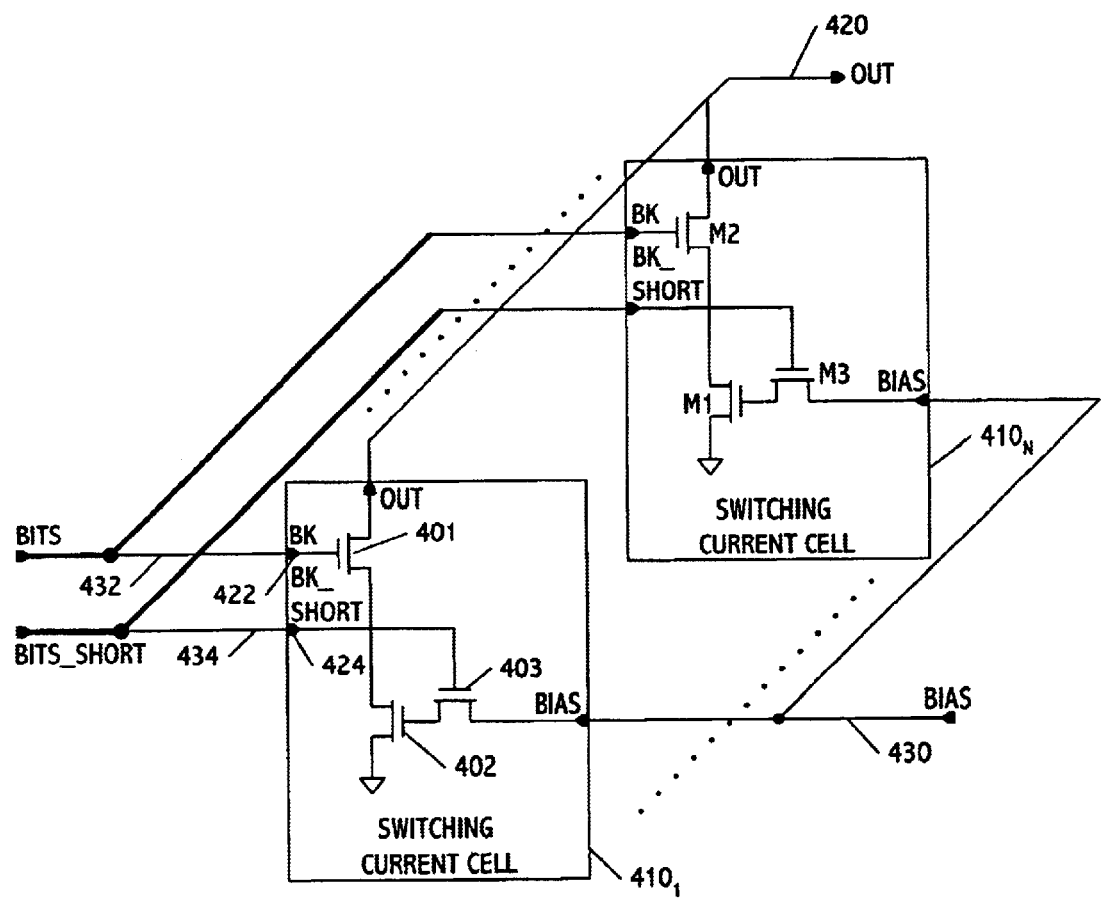
FIG. 4

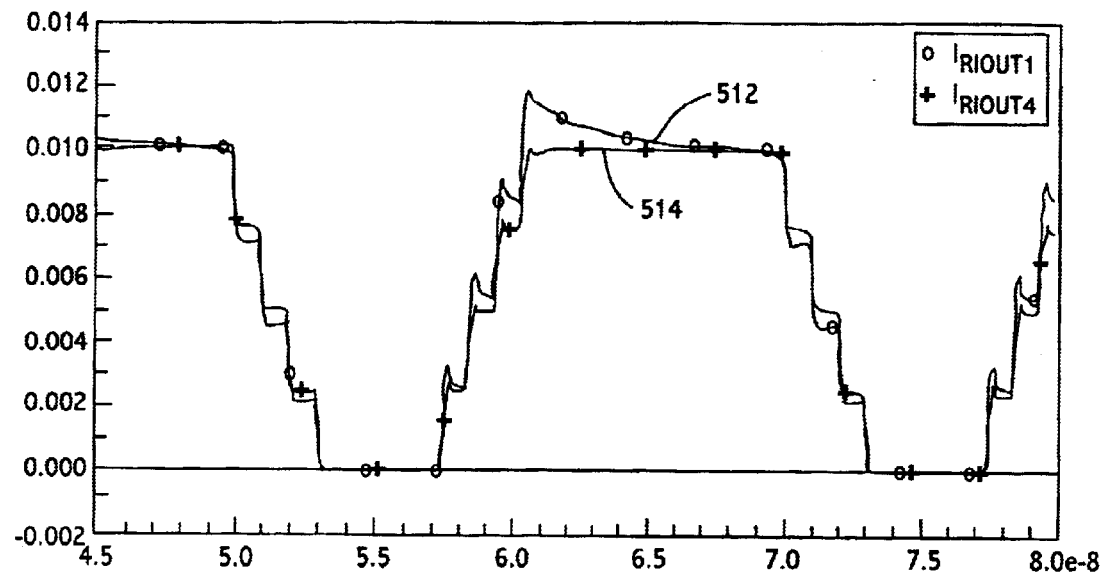
FIG. 5A
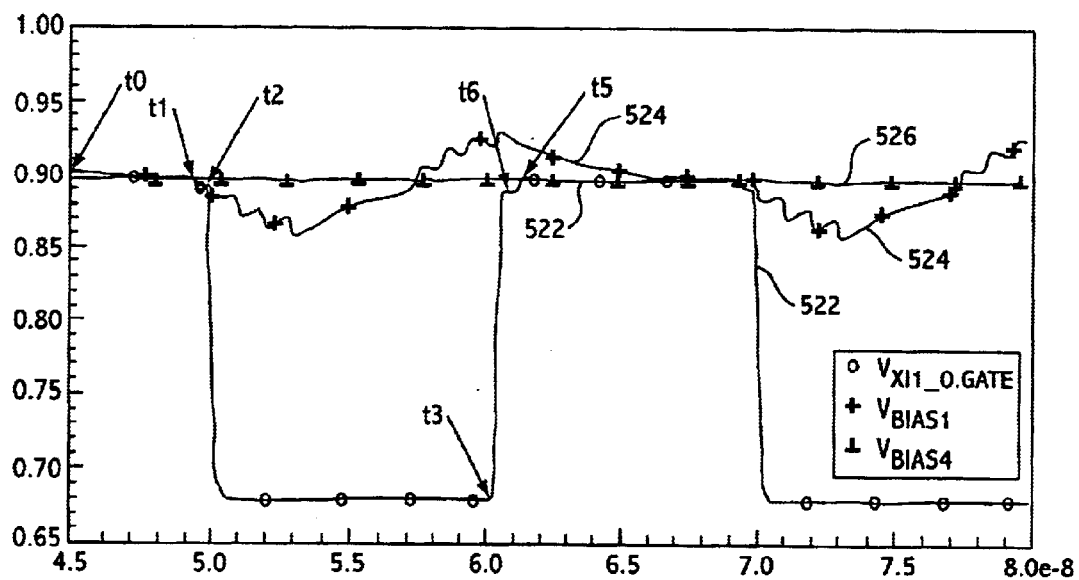
FIG. 5B

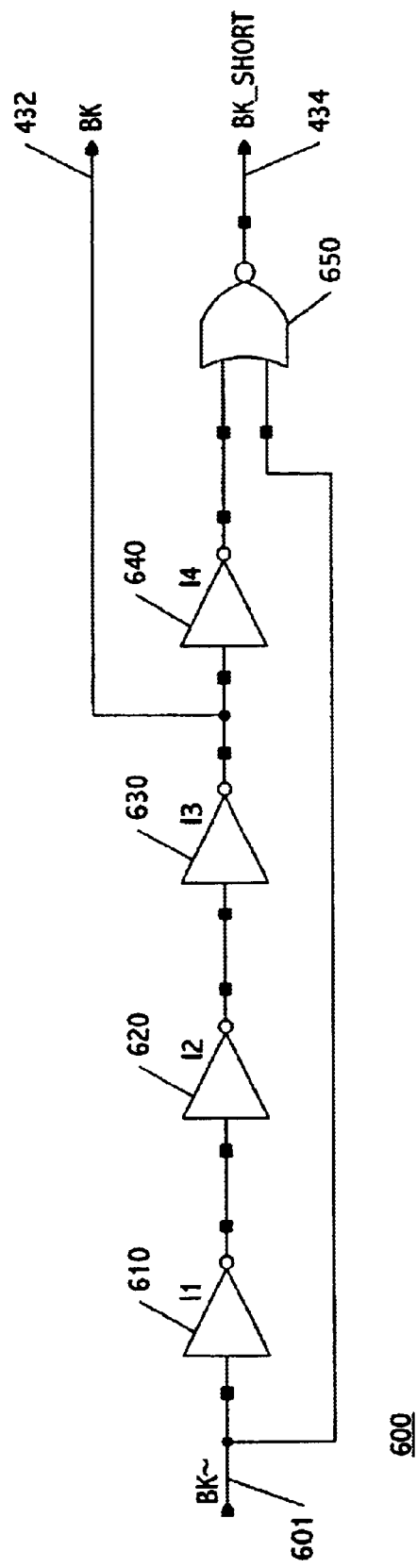
FIG. 6

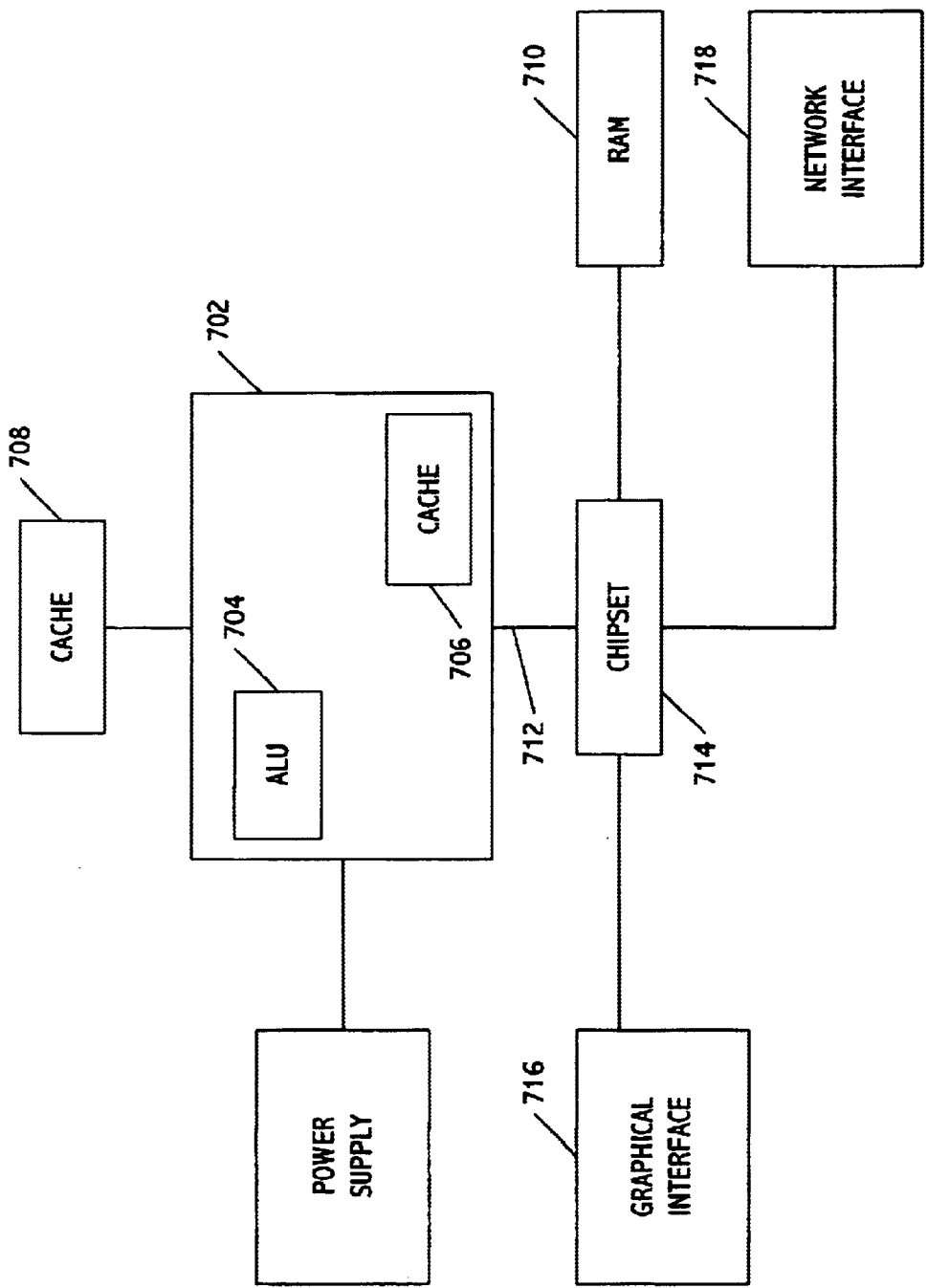
FIG. 7

SINGLE ENDED CONTROLLED CURRENT SOURCE

Embodiments of the present invention relate to circuit design. In particular, embodiments of the present invention relate to controlled current source circuits.

BACKGROUND

Controlled current sources ate widely used in modern circuit design. In digital circuits they can be used in the final stages of the circuit output drivers. In mixed signal circuits controlled current sources can be used in line drivers, special waveform generators, switched current circuits, digital to analog converters, and the like.

In mixed signal and pure analog applications the controlled current source is typically configured as a current steering digital to analog converter (D/A). A simplified schematic of a current steering D/A converter 100 is presented in FIG. 1. The converter 100 contains a plurality of differential switching current cells $110_1$–$110_n$ connected to differential output lines OUT+ and OUT–. The cells are connected to a common bias voltage BIAS, which establishes the value of the current in each cell $110_1$–$110_n$. The current is switched between outputs OUT+ and OUT– by complementary digital input signals Bk and Bk~. The cells can be made identical or can be binary weighted. In special function generators additional current ratio schemes can be used, as is known in the art.

If only a single ended output is used, the described differential architecture of FIG. 1 is often used anyway. The differential architecture is used to reduce noise generation on power and ground lines, as well as to reduce the effect of the noise on the differential signal. Additionally, the differential architecture can also be used to reduce the switching noise effect on the common bias signal. In the single ended case the unused output is connected to the power line and the respective current from that output is wasted. This additional power consumption can be acceptable in some applications (e.g., internal blocks). If used in other applications (e.g., output drivers), this wasted current leads to a significant loss of power efficiency. Therefore, the noise associated with typical single ended controlled current sources is an obstacle in achieving power savings in noise sensitive applications.

This noise problem can be better understood with the reference to the circuits illustrated in FIGS. 2A and 2B. FIGS. 2A and 2B show two designs having a plurality of single ended controlled current cells $210_1$–$210_n$ and $220_1$–$220_n$ connected to the single output OUT.

In FIG. 2A, the gate of the current controlled transistor M1 is permanently connected to the bias voltage source BIAS, while the drain is controlled by switching transistor M2. This configuration can be obtained from the circuit shown in FIG. 1 by removing one of the switching transistors.

However, the circuits of FIG. 1 and FIG. 2A have substantial differences. In the differential application of FIG. 1, the drain voltage of the current control transistor M1 never goes to ground and the transistor M1 is always in saturation mode. Due to modern metal-oxide semiconductor (MOS) processes, the parasitic drain-gate capacitance is typically very small and the voltage bouncing on the drain does not significantly penetrate to the gate node. Further, if the transistor is connected in a cascode scheme, the effect is reduced even further.

In FIG. 2A, the drain voltage of the current controlling transistor M1 approaches ground, if the switching transistor M2 is OFF. Thus, the current control transistor M1 changes between linear and saturation modes. This causes a significant change of the charge accumulated in the transistor gate-source capacitor. Using a cascode scheme does not make any difference for this case because the drain voltage of the transistor goes to ground anyway since the current is turned OFF. Accordingly, the noise penetrating to the bias voltage line is substantial and can corrupt the performance of the entire controlled current source during the transition time.

Referring to FIG. 2B, the gate voltage of the current controlled transistor M1 is switched between the ground and the bias voltage. In this case the value of the gate charge change is approximately twice that of the schematic of FIG. 2A. However, the size of the switching transistor M2 and voltage of signal Bk can be chosen in such a way that the charge introduced by the current controlled transistor M1 is partially compensated by the charge of the switching transistor M2. A partial compensation is possible during the turn ON mode. During a turn OFF mode, transistor M2 removes some charge from the bias line. Accordingly, reducing the switching noise penetration in the bias voltage signal line can improve the accuracy of the controlled single ended current sources. However, noise remains a problem in single-ended current sources.

BRIEF DESCRIPTION OF THE DRAWINGS

Arrangements and embodiments will be described in detail with reference to the following drawings in which like reference numerals refer to like elements wherein:

FIG. 1 illustrates an example arrangement of a differential controlled current source design;

FIG. 2A illustrates an example arrangement of a single-ended controlled current source design;

FIG. 2B illustrates another example arrangement of single-ended controlled current source design;

FIG. 3 illustrates a controlled current source design according to an example embodiment of the present invention;

FIG. 4 illustrates a controlled current source with dynamic charge storage according to an example embodiment of the present invention;

FIGS. 5A and 5B illustrate waveforms comparing controlled current sources according to an example embodiment of the present invention and according an example arrangement of FIG. 2A;

FIG. 6 illustrates a clock pulse generator according to an example embodiment of the present invention; and FIG. 7 illustrates a system level diagram of a computer system according to an example embodiment of the present invention.

DETAILED DESCRIPTION

In the following detailed description, reference is made to the accompanying drawings that show, by way of illustration, specific embodiments in which the invention may be practiced. In the drawings, like numerals describe substantially similar components throughout the several views. While logic values are described as HIGH/ON or LOW/OFF these descriptions of HIGH/ON and LOW/OFF are intended to be relative to the discussed arrangement and/or embodiments. That is, a value may be described as HIGH/ON in one arrangement, although it may be LOW/OFF in another (e.g., complementary) arrangement as will be appreciated by those skilled in the art.

The following embodiments are described in sufficient detail to enable those skilled in the art to practice the invention. Other embodiments may be utilized, and structural, logical and intellectual changes may be made without departing from the scope of the present invention. Moreover, it is to be understood that various embodiments of the invention, although different, ate not necessarily mutually exclusive. For example, a particular feature, structure, or characteristic described in one embodiment may be included within other embodiments. The following detailed description is not to be taken in a limiting sense, and the scope of the present invention is defined only by appended claims, along with the full scope of equivalence to which such claims are entitled.

FIG. 3 illustrates a controlled current source according to an embodiment of the present invention. Other embodiments are also within the scope of the invention. A current source 300 may include a plurality of current cells $310_1$–$310_n$ connected to a common output node 320. Each cell contains a current control transistor 302 and switching transistor 301 connected between the output node 320 and the drain node of the current control transistor 302. The gate of the switching transistor 301 is controlled by digital input 322 (Bk). The gate of the current control transistor 302 is coupled to the common bias voltage node 330 by resistor R1. The value of resistor R1 may be such that the time constant associated with gate voltage of transistor 302 should exceed the delay time between the signals 322 (Bk) and 324 (Bk~). Otherwise, the bias line 330 may be affected by the charge injection during the dock transition. A compensation transistor 303 of the same type as the current control transistor 302 may be included in the cell. The gate and substrate of compensation transistor 303 are connected to the respective gate and substrate of the current control transistor 302 at nodes 312 and 314, respectively. The source and drain of compensation transistor 303 are connected together at node 316 to the digital input 324 (Bk~), which is complementary to input signal 332 (Bk).

When configured as illustrated in FIG. 3, the charge accumulated in the channel of the compensation transistor 303 may be proportional to the charge accumulated in the current control transistor 302. This charge may be weakly dependent on the value of the voltage of the digital signal Bk~ and follows the mode of operation, process and temperature variations of the charge introduced by the current control transistor 302. Accordingly, by properly choosing the areas of the transistors 302 and 303, it is possible to achieve substantial (e.g., up to an order of magnitude) compensation of the charge injected into the bias signal line 330. For relatively long channels the charge accumulated by the gate of a MOS transistor in a saturation mode is about ⅔ of the gate charge of a MOS in a capacitor configuration. Thus ⅓ of the total charge value should be compensated by transistor 303 and the gate area ratio of transistors 302 and 303 should be approximately 3:1. However, those skilled in the art will appreciate that other ratios can be used.

Further, those skilled in the art will appreciate that the charge injection compensation technique is widely used in switched capacitor applications. In switched capacitor applications, the charge injected into the signal line by the switching transistor is compensated with an additional replica transistor connected to the same signal line and controlled by a complementary clock. Although similar in appearance, these methods have substantial differences. Usually the charge injected by a switch is strongly dependent on the clock signal amplitude. For the switched capacitor configuration, a complementary clock controls the compensation transistor and good compensation is achieved only due to the fact that both transistors operate with the same clock amplitude.

In contrast, embodiments of the present invention can provide a compensation method that is applicable to the charge introduced by transistor 301 into signal lie 320. However, transistor 302, affecting the bias signal line 330 and creating the greatest noise in a single ended application, does not operate with any clock signals applied to its terminals.

In the illustrated embodiment of FIG. 3, transistor 302 can operate with a permanently changing drain voltage, which is not correlated with the clock amplitude applied to the source-drain of the compensation transistor 303. Further, in this configuration the charges injected into the bias signal line 330 by the current gate of the control transistor 302 and the gate of the compensation transistor 303 are virtually independent of the clock signal amplitude. Instead, they depend on the bias voltage, which is common for the both transistors 302 and 303, and the MOS transistor parameters, which are matched due to the nature of the integrated circuit process. Thus, if the ratio (e.g., 3:1 as discussed above) of the transistors is chosen properly, an optimal charge injection compensation can be preserved within clock amplitude, bias voltage, MOS transistor parameters, process, and temperature variations.

Accordingly, an embodiment of the present invention may include an apparatus comprising at least one current cell. Each current cell may include first, second and third transistors. The first transistor is configured as a switching transistor. The first transistor may be coupled to a first input and to an output. The first input may be configured to receive a first signal. The second transistor may be coupled in series with the first transistor. The second transistor may be configured as a current control transistor and may be coupled to a bias input. The third transistor has a gate and a substrate coupled to a gate and a substrate of the second transistor, respectively, and a drain and source coupled to a second input. The second input is configured to receive a second signal that is a compliment of the first signal.

As illustrated in FIG. 3, for example, the apparatus can include a plurality of current cells (e.g., $310_1$–$310_n$) coupled in parallel to the output (e.g., 320) and the bias input (e.g., 330). Further, the plurality of cells is coupled to a plurality of digital input signals at the first and second inputs (e.g., 322 and 324), respectively. Those skilled in art will appreciate that the foregoing embodiment can be used in a variety of applications and realized in a variety of configurations. For example, each current cell can be similar to produce a linear increase as each cell is activated. Alternatively, each current cell can be designed to provide a different current weighting (e.g., a binary weighting). Accordingly, apparatuses according to embodiments of the present invention can include a digital to analog converter, wave-shaper, controlled current source, pulse generator, and the like.

Another embodiment of the present invention is illustrated in FIG. 4. The controlled current source includes a plurality of current cells $410_1$–$410_n$ connected to the common output node 420. Each cell contains a current control transistor 402 and switching transistor 401 coupled between the output node 420 and the drain node of the current control transistor 401. The gate of the switching transistor 401 is controlled by input 422 (e.g., signal Bk 432). The gate of the current control transistor 402 is coupled with the common bias voltage node 430 via switching transistor 403. When transistor 403 is turned OFF, the gate of the current control transistor 402 is floating. The gate of transistor 403 is controlled by another signal (Bk_short) 434 received at input 424. Signal Bk_short 434 is logically equivalent to signal Bk 432 but it should go HIGH after signal Bk 432 goes HIGH and should go LOW before signal Bk 432 goes LOW.

Accordingly, an embodiment of the present invention may include at least one current cell that has first, second, and third transistors. The first transistor is configured as a switching transistor. The first transistor is coupled to a first input and to an output. The first input is configured to receive a first signal. The second transistor is coupled in series with the first transistor and is configured as a current control transistor. The third transistor is configured as a switching transistor between a bias input and a gate of the second transistor. The third transistor is coupled to a second input configured to receive a second signal. As discussed in the foregoing description, the second signal goes high after the first signal goes high and the second signal goes low before the first signal goes low.

Further, as illustrated in FIG. 4, the apparatus can further comprise a plurality of current cells coupled in parallel at respective outputs and bias inputs. Similarly, those skilled in art will appreciate that foregoing embodiment can be used in a variety of applications and realized in a variety of configurations. For example, each current cell can be similar to produce a linear increase as each cell is activated. Alternatively, each current cell can be designed to provide a different current weighting (e.g., a binary weighting). Accordingly, embodiments of the present invention can include a digital to analog converter, wave-shaper, controlled current source, pulse generator, and the like.

The current and voltage timing diagrams of pulse shaping circuits according to embodiments of the present invention and the arrangement of the cell of FIG. 2A, are illustrated in FIGS. 5A and 5B. The diagrams are obtained by simulation of the illustrated circuits. In FIG. 5A I(RIOUT1) 512 and I(RIOUT4) 514 represent the output currents of a typical pulse shaper (e.g., FIG. 2A) and an embodiment of the present invention (e.g., FIG. 4), respectively. In FIG. 5B V(XI1_0.GATE) 522 represents the gate voltage of transistor 402 (as illustrated in FIG. 4) of one of four current cells used in a pulse shaper. V(BIAS1) 524 and V(BIAS4) 526 represent the bias voltage of the typical pulse shaper (e.g., as illustrated in FIG. 2A) and an embodiment of the present invention (e.g., as illustrated in FIG. 4), respectively. The effectiveness of embodiments of the present invention in reducing the noise is readily apparent from a review of FIGS. 5A and 5B.

Referring to FIG. 5B and FIG. 4, during the time period t0–t1 compensation transistor 403 is turned ON by the HIGH value of signal Bk_short. The bias voltage is applied to the gate of the current control transistor 402. Accordingly, transistor 402 is in saturation mode due to transistor 401, which is turned on by the HIGH value of the signal Bk 432.

At time period t1–t2 compensation transistor 403 is turned OFF isolating the gate of the current control transistor 402. The voltage at the gate node of transistor 402 is slightly reduced due to the charge injected by transistor 401. However, this charge is not significant to the circuit operation because the size of transistor 401 can be minimized according to embodiments of the present invention.

At time period t2–t3 transistor 401 is turned OFF by signal Bk isolating the drain of the current control transistor 402. A significant charge is taken out of the gate node of current control transistor 402 due to the excursion of the drain node to ground voltage. This causes a related voltage drop at the gate node. This voltage does not affect the performance of the controlled current source because the current control transistor 402 is isolated. The charge at the gate node is stored because this node is disconnected by transistor 403.

At time period t3–t4 transistor 401 is turned ON and the current control transistor 402 is returning to saturation mode. This returns approximately the same charge value to the gate node and restores the value of the gate voltage.

At time period t5, transistor 403 is turning ON, connecting the gate of the current control transistor 402 back to the bias voltage line 430. During this transition transistor 403 returns approximately the same charge to the current control transistor 402 gate node as was removed when signal Bk_short turned LOW.

Therefore, when transistor 403 turns ON the voltages at the both sides of transistor 403 become substantially equal. Accordingly, no substantial charge is injected into the bias signal line 430 and no significant current is passed through transistor 403. Therefore, transistor 403 can be made very small and further reduce the charge injection effect.

FIG. 6 illustrates a circuit diagram for generating signal Bk and Bk_short according to an example embodiment of the present invention. Other embodiments are also within the scope of the present invention. The circuit contains four inverters 610–640 and a NOR gate 650. The NOR gate 650 output goes LOW as soon as the input of the first inverter 610 goes HIGH. Hence it happens before signal Bk goes LOW. Likewise, Bk_short goes HIGH only after the output of the last inverter goes LOW, hence it happens after Bk goes HIGH. Those skilled in the art will appreciate that other circuits can be devised to accomplish the above-discussed relationship of Bk and Bk_short.

Accordingly, embodiments of the present can include logic 600 configured to generate a first signal 432 and a second signal 434. The second signal 434 goes high after the first signal 432 goes high and the second signal 434 goes low before the first signal 432 goes low.

Embodiments of the present invention can be used in a wide variety of applications including but not limited to computer systems. FIG. 7 shows an exemplary illustration of a computer system. The computer system can include a microprocessor 702, which can include controlled current sources according to embodiments of the present invention. Microprocessor 702 can include many sub-blocks such as an arithmetic logic unit. (ALU) 704 and an on-die cache 706. The microprocessor 702 may also communicate to other levels of cache, such as off-die cache 708. Higher memory hierarchy levels such as system memory 710 are accessed via host bus 712 and a chip set 714. In addition, other off-die functional units such as a graphics accelerator 716 and a network interface controller 718, to name just a few, may communicate with the microprocessor 702 via appropriate busses or ports.

Embodiments of the present invention can include line drivers of the network interface chip 718 using controlled current sources described above (e.g., FIGS. 3 and 4) to reduce the power consumption of the driver by choosing B-class operation versus A-class operation. Further, embodiments of the present invention can include drivers of any interface buses and lines interconnecting the other chips (e.g., bus 712), as will be appreciated by those skilled in the art.

In single ended digital signal drivers according to embodiments of the present invention, circuits such as illustrated in FIGS. 3 and 4 can be used to control the slope of the pulses more accurately than conventional circuits. Conventional circuits perform a tough pulse shaping by consecutively turning ON a plurality of N-MOS and P-MOS transistors and providing their currents to the output driver. In differential high-speed digital interfaces (e.g., in B-class network line drivers) according to the present invention, circuits, such as illustrated in FIGS. 3 and 4, can be used to reduce the current consumption of these devices.

Those skilled in the art will appreciate that embodiments of the present invention can include methods for controlling current sources as is apparent from the foregoing description and figures. Accordingly, an embodiment of the present invention includes a method of controlling a current source comprising receiving a first signal that controls a first switching transistor. The first switching transistor is coupled to an output. A bias signal is received that controls a second transistor configured as a current source. The second transistor is coupled in series with the first transistor. A second signal is received that is a compliment of the first signal. The second signal is coupled to a drain and a source of the third transistor and a gate and a substrate of the third transistor are coupled to a gate and a substrate of the second transistor, respectively.

Further, another embodiment of the present invention includes a method comprising receiving a first signal that controls a first transistor. The first transistor is coupled between an output and a second transistor. A second signal is received that turns on a third transistor after the first signal turns on the first transistor and turns off the third transistor before the first signal turns off the first transistor. The third transistor is coupled between a gate of the second transistor and a bias voltage input.

Further as can be understood from the foregoing description, embodiments of the invention can include methods of coupling a plurality of current cells. Further, the plurality of current sources can be used to generate an incrementally increasing output where each current produces approximately the same current output as each cell is activated. Alternatively, each current cell can be designed to provide a different current weighting, for example, generating a current output that increases in a binary weighted manner as each cell is successively turned on (e.g., 1, 2, 4, times the current for cells 1, 2, 3, respectively). Those skilled in the art will appreciate that embodiments of the invention include other linear and non-linear weighting of the current cells, so as yield a desired output.

The foregoing description has been illustrated using N-type MOSFETs (Metal Oxide Semiconductor Field Effect Transistor). However, those skilled in the art will appreciate that P-type MOSFETs can be substituted for the N-type MOSFETS. For example, in an N-type configuration the second signal 434 (Bk_short) goes HIGH after the first signal 432 (Bk) goes HIGH and goes LOW before the first signal 432 (Bk) goes LOW, thereby turning transistor 403 on after transistor 401 is turned ON and OFF before transistor 401 is turned OFF. However, for a P-type circuit the logic would be inverted so that signal 434 (Bk_short) would go LOW after signal 432 (Bk) goes LOW and HIGH before signal 432 (Bk) goes high, thereby turning transistor 403 on after transistor 401 is turned ON and OFF before transistor 401 is turned OFF.

The foregoing embodiments and advantages are merely exemplary and are not to be construed as limiting the present invention. The foregoing embodiments can be readily applied to other types of apparatuses. Accordingly, the description of embodiments of the present invention is intended to be illustrative, and not to limit the scope of the claims.

Many alternatives, modifications, and variations will be apparent to those skilled in the art. For example, the foregoing description has been illustrated using N-type and/or P-type MOSFETs. However, those skilled in the art will appreciate that a complementary form can be realized by utilizing the complementary transistor type either to the entire arrangement or portions thereof and constitutes additional embodiments of the present invention. Further, although embodiments of the invention have been illustrated and described in the foregoing description as individual circuits and/or arrangements elements, the individual circuits and arrangements elements can be integrated into larger scale devices (e.g., microprocessors) or can be separated into smaller arrangements/circuits without departing from the scope of the present invention.

What is claimed is:

1. A current cell comprising:
   a first transistor coupled to an output of the current cell and to a first input of the current cell;
   a second transistor coupled in series with the first transistor and coupled to a bias input; and
   a third transistor having a gate and a substrate coupled to a gate and a substrate of the second transistor, respectively, and a drain and a source coupled to a second input of the cell.

2. The current cell of claim 1, having a gate of the first transistor coupled to the first input, a drain of the first transistor coupled to the output, a source of the first transistor coupled to a drain of the second transistor, and a source of the second transistor coupled to a ground.

3. The current cell of claim 1, wherein the second input of the current cell is configured to receive a signal that is a compliment of the first signal received at the first input.

4. The current cell of claim 1, wherein the first transistor is configured as a switching transistor, and the second transistor is configured as a current source.

5. The current cell of claim 1, further comprising:
   a resistor coupled between the gates of the second and third transistors and the bias input.

6. The current cell of claim 1, wherein each of the first, second, and third transistors are at least one of N-type MOSFETs and P-type MOSFETs.

7. An apparatus comprising a plurality of current cells, wherein each current cell includes:
   a first transistor configured as a switching transistor, the first transistor is coupled to an output and to a first input configured to receive a first signal;
   a second transistor coupled in series with the first transistor, the second transistor is configured as a current control transistor and is coupled to a bias input; and
   a third transistor having a gate and a substrate coupled to a gate and a substrate of the second transistor, respectively, and a drain and a source coupled to a second input configured to receive a second signal that is a compliment of the first signal.

8. The apparatus of claim 7, wherein the plurality of current cells are coupled in parallel at respective outputs and bias inputs and the plurality of cells are coupled to a plurality of digital signals at respective first and second inputs.

9. The apparatus of claim 7, wherein each cell further includes:
   a resistor coupled between a gate of the second transistor and the bias input.

10. The apparatus of claim 7, wherein the apparatus comprises at least one of a digital to analog converter, wave-shaper, controlled current source, pulse generator, a microprocessor, a computer system, a network interface device, a bus interface, and a single ended digital signal driver.

11. A current cell comprising:
a first transistor of a current cell coupled to a common output of a plurality of current cells and the first transistor coupled to a first input of the current cell;
a second transistor of the current cell coupled in series with the first transistor; and
a third transistor of the current cell coupled between a bias input of the current cell and a gate of the second transistor, a gate of the third transistor is coupled to a second input of the current cell.

12. The circuit of claim 11, having a gate of the first transistor coupled to the first input, a drain of the first transistor coupled to the output, a source of the first transistor coupled to a drain of the second transistor, a source of the second transistor coupled to a ground, a drain of the third transistor coupled to the bias input, and a source of the third transistor coupled to the gate of the second transistor.

13. The circuit of claim 11, further comprising:
logic configured to generate a first signal and a second signal, wherein the second signal HIGH after the first signal goes HIGH, the second signal goes LOW before the first signal goes LOW and, the first signal is coupled to the first input and the second signal is coupled to the second input.

14. The apparatus of claim 13, wherein the logic comprises:
a first, a second, a third and a fourth inverter coupled in a series configuration; and
a NOR gate having a first gate input coupled to an output of the fourth inverter and a second gate input coupled to an input of the first inverter and to a reference signal, wherein the first signal is generated at a node coupling an output of the third inverter to an input of the fourth inverter and wherein the second signal is generated by an output of the NOR gate.

15. The circuit of claim 11, wherein the first, second, and third transistors are at least one of N-type MOSFETs and P-type MOSFETs.

16. An apparatus comprising at least one current cell, each current cell including:
a first transistor configured as a switching transistor, the first transistor coupled to a common output of each of the current cells and to a first input configured to receive a first signal;
a second transistor coupled in series with the first transistor, the second transistor configured as a current control transistor; and
a third transistor configured as a switching transistor between a bias input and a gate of the second transistor, the third transistor coupled to a second input configured to receive a second signal.

17. The apparatus of claim 16, wherein the apparatus comprises at least one of a digital to analog converter, wave-shaper, controlled current source, pulse generator, a microprocessor, a computer system, a network interface device, a bus interface, and a single ended digital signal driver.

18. The apparatus of claim 17, wherein the single ended digital signal driver comprises a B-class driver.

19. The apparatus of claim 16, wherein each cell is coupled to logic configured to generate a first signal and a second signal, wherein the second signal goes high after the first signal goes high and wherein the second signal goes low before the first signal goes low and wherein the first signal is coupled to the first input and the second signal is coupled to the second input.

20. A method of controlling a current source comprising:
receiving a first signal that controls a first switching transistor, wherein the first switching transistor is coupled to an output;
receiving a bias signal that controls a second transistor configured as a current source, wherein the second transistor is coupled in series with the first transistor; and
receiving a second signal that is a compliment of the first signal, wherein the second signal is coupled to a drain and a source of the third transistor and wherein a gate and a substrate of the third transistor are coupled to a gate and a substrate of the second transistor, respectively.

21. The method of claim 20, further comprising:
coupling a plurality of current cells in parallel at respective outputs and bias inputs, wherein each current cell includes first, the second and the third transistors and inputs to receive bias, first and second input signals and an output.

22. The method of claim 21, further comprising:
receiving a plurality of digital signals at first and second inputs of the plurality of cells.

23. The method of claim 22, wherein the first, second and third transistors are N-type MOSFETs.

24. The method of claim 22, wherein the first, second and third transistors are P-type MOSFETs.

25. The method of claim 20, wherein the first second and third transistors are N-type MOSFETs.

26. The method of claim 20, wherein the first, second and third transistors are P-type MOSFETs.

27. A method of controlling a current source comprising:
receiving a first signal that controls a first transistor, the first transistor being coupled between an output and a second transistor; and
receiving a second signal that turns ON a third transistor after the first signal turns ON the first transistor and turns OFF the third transistor before the first signal turns OFF the first transistor, the third transistor being coupled between a gate of the second transistor and a bias voltage input.

28. The method of claim 27, further comprising:
coupling a plurality of current cells in parallel at respective outputs and bias inputs, wherein each current cell includes the first, the second and the third transistors and inputs for receiving a bias, first and second input signals and an output.

29. The method of claim 28, further comprising:
receiving a plurality of digital signals at respective first and second inputs of the plurality of cells.

30. The method of claim 27, further comprising:
generating the first signal and the second signal from a reference signal.

31. The method of claim 27, wherein the first, second and third transistors are at least one of N-type and P-type MOSFETs.

32. An electronic system comprising:
a network interface device to communicate with network devices;
a die having a plurality of current cells, one of the current cells including:

a first transistor coupled to an output of the current cell and to a first input of the current cell;

a second transistor coupled in series with the first transistor and coupled to a bias input; and a third transistor having a gate and a substrate coupled to a gate and a substrate of the second transistor, respectively, and a drain and a source coupled to a second input of the cell.

33. The electronic system of claim 32, wherein a gate of the first transistor is coupled to the first input, a drain of the first transistor is coupled to the output, a source of the first transistor is coupled to a drain of the second transistor, and a source of the second transistor is coupled to a ground.

34. The electronic system of claim 32, wherein the second input of the one current cell is configured to receive a signal that is a compliment of the first signal received at the first input.

35. The electronic system of claim 32, wherein the first transistor is configured as a switching transistor, and the second transistor is configured as a current source.

* * * * *